United States Patent
Jeong

(10) Patent No.: US 8,519,920 B2
(45) Date of Patent: Aug. 27, 2013

(54) ORGANIC LIGHT EMITTING DEVICE

(75) Inventor: Yunsik Jeong, Gumi (KR)

(73) Assignee: LG Display Co., Ltd., Seoul (KR)

( * ) Notice: Subject to any disclaimer, the term of this patent is extended or adjusted under 35 U.S.C. 154(b) by 1330 days.

(21) Appl. No.: 11/987,749

(22) Filed: Dec. 4, 2007

(65) Prior Publication Data

US 2009/0135104 A1 May 28, 2009

(30) Foreign Application Priority Data

Nov. 27, 2007 (KR) .................. 10-2007-0121528

(51) Int. Cl.
*G09G 3/32* (2006.01)

(52) U.S. Cl.
USPC ............................................... 345/83

(58) Field of Classification Search
USPC ............... 345/76, 94, 212, 82, 83; 327/540
See application file for complete search history.

(56) References Cited

U.S. PATENT DOCUMENTS

| | | | | |
|---|---|---|---|---|
| 6,762,564 B2 * | 7/2004 | Noguchi et al. | ............ | 315/169.1 |
| 2003/0189210 A1 * | 10/2003 | Yamazaki et al. | ............... | 257/72 |
| 2006/0022969 A1 * | 2/2006 | Lee et al. | ...................... | 345/211 |
| 2006/0175706 A1 * | 8/2006 | Lee et al. | ...................... | 257/763 |
| 2006/0183338 A1 * | 8/2006 | Kim et al. | ...................... | 438/745 |

* cited by examiner

*Primary Examiner* — Quan-Zhen Wang
*Assistant Examiner* — Calvin C Ma
(74) *Attorney, Agent, or Firm* — Morgan, Lewis & Bockius LLP

(57) ABSTRACT

An organic light emitting device includes a substrate having a plurality of pixels, each pixel comprising a plurality of sub-pixels. Each sub-pixel includes an emission area that has a first electrode, a second electrode and an emitting layer, with the emitting layer of at least one sub-pixel includes a phosphorescence material. In addition to these features, the device includes a scan line to provide scan signal to a corresponding sub-pixel, a data line configured to supply data signal to a corresponding sub-pixel, and a power supply line to provide power to a corresponding sub-pixel. The data line and power supply line have a single-layer structure, and a taper angle of each of the data line and the power supply line lies in a predetermined range.

13 Claims, 3 Drawing Sheets

ORGANIC LIGHT EMITTING DEVICE

This application claims priority from Korean Patent Application Nos. 10-2007-0121528, filed Nov. 27, 2007, the subject matters of which are incorporated herein by reference.

BACKGROUND

1. Field

One or more embodiments described herein relate to a display device.

2. Background

The importance of flat panel displays has recently increased with consumer demand for multimedia products and services. An organic light emitting device (OLED) is desirable because it has a rapid response time, low power consumption, self-emission structure, and wide viewing angle. In spite of their many advantages, OLEDs tend to have non-uniform luminance characteristics which degrade reliability.

DETAILED DESCRIPTION

Organic light emitting devices may be classified as passive matrix or active matrix devices. In a passive matrix device, anode electrodes are oriented at right angles to cathode electrodes, and the device is driven by a line-selection scheme. In an active matrix device, a thin-film transistor is connected to each pixel (or sub-pixel) electrode and the device is driven based on the capacitance of a capacitor connected to a gate electrode of the thin film transistor.

Also, in active matrix device, scan and data signals are supplied to sub-pixels through corresponding scan and data lines, and light is emitted based on electrical power supplied to the sub-pixels through one or more power supply lines. However, because the scan, data, and power supply lines are made of a metal, signals supplied to a sub-pixel far away from a supply source may be distorted compared to signals supplied to a sub-pixel bear the supply source. This effect is caused, at least in part, by the resistance associated with the lines. As a result, luminance of the organic light emitting device is not uniform, which adversely affects reliability.

Figure 1:
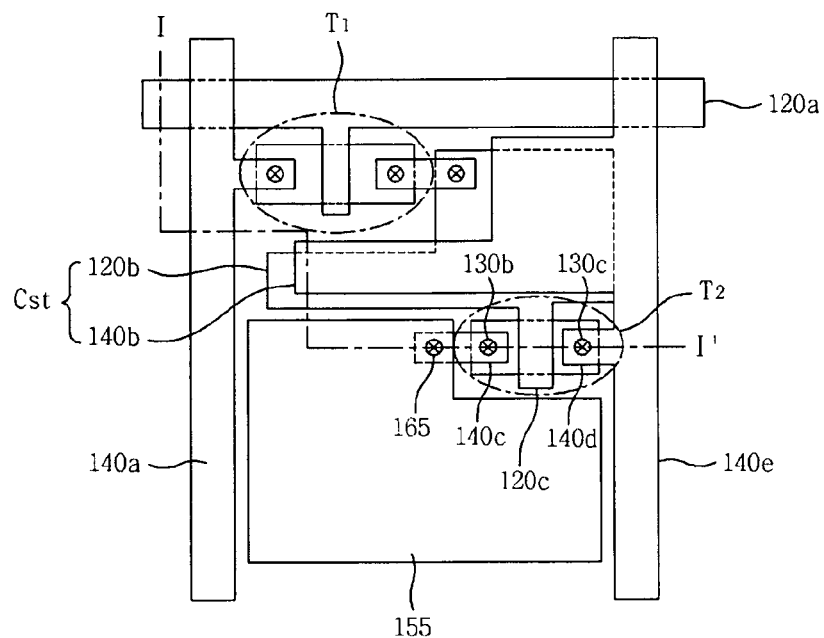
FIG. 1 is a view of one embodiment of an organic light emitting device.

As described herein, an organic light emitting device may be provided to include a substrate having a plurality of pixels, each pixel comprising a plurality of sub-pixels. FIG. 1 shows a structure of one embodiment of a sub-pixel of the organic light emitting device. This structure includes a substrate 100 having a sub-pixel area and a non-sub-pixel area. The sub-pixel area is defined by a scan line 120a positioned in one direction, a data line 140a positioned perpendicular to the scan line, and a power supply line 140e parallel to the data line. The scan line, data line, and power supply line are positioned in the non-sub-pixel area.

The sub-pixel area includes a switching thin film transistor T1 connected to scan line 120a and data line 140a, a capacitor Cst connected to the switching thin film transistor T1 and the power supply line 140e, and a driving thin film transistor T2 connected to the capacitor Cst and the power supply line. The capacitor Cst may include a capacitor lower electrode 120b and a capacitor upper electrode 140a.

An organic light emitting diode is also positioned in the sub-pixel area. The organic light emitting diode includes a first electrode 155 electrically connected to the driving thin film transistor T2, an emitting layer (not shown) positioned on the first electrode 155, and a second electrode (not shown).

Figure 2:
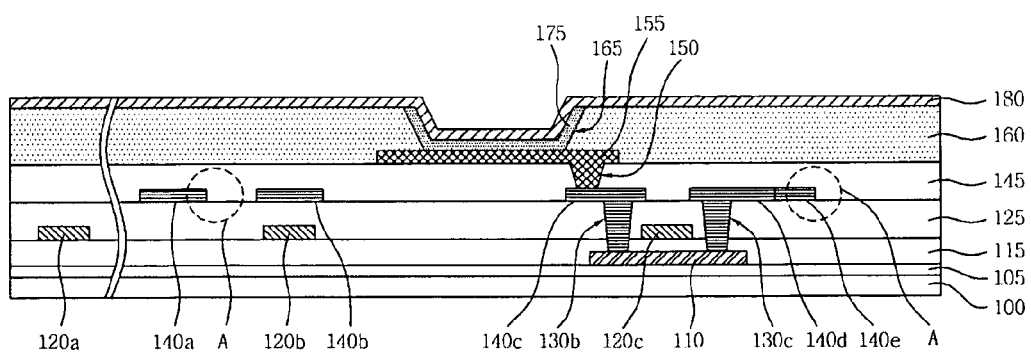
FIG. 2 is a cross-sectional view taken along a line I-I' of FIG. 1.

FIG. 2 is a cross-sectional view taken along a line I-I' of FIG. 1. As shown, a buffer layer 105 is positioned on the substrate and serves to protect a thin film transistor from impurities (such as alkali ions) discharged from the substrate during a subsequent process. The buffer layer may be selectively formed using silicon oxide ($SiO_2$) or silicon nitride ($SiN_x$), and the substrate may be formed of glass, plastic, or metal.

A semiconductor layer 110 is positioned on the buffer layer and may be formed from amorphous silicon or crystallized poly-silicon. The semiconductor layer may include a source area and a drain area having p-type or n-type impurities, as well as a channel area.

A first insulating layer 115, which may be a gate insulating layer, is positioned on the semiconductor layer. The first insulating layer may be made of a silicon oxide ($SiO_2$) layer or a silicon nitride ($SiN_x$) layer, or may have a multi-layered structure formed from a combination thereof.

A gate electrode 120c is positioned on the first insulating layer 115 in a given area of the semiconductor layer, e.g., in a location corresponding to the channel area of the semiconductor layer where impurities are doped. The scan line 120a and capacitor lower electrode 120b may be positioned on the same formation layer as the gate electrode.

The gate electrode 120c may be made of any one of molybdenum (Mo), aluminum (Al), chromium (Cr), gold (Au), titanium (Ii), nickel (Ni), neodymium (Nd), or copper (Cu) or a combination thereof. The gate electrode may have a multi-layered structure made of Mo, Al, Cr, Au, Ti, Ni, Nd, or Cu, or a combination thereof, or a double-layer structure made, for example, of Mo/Al—Nd.

The scan line 120a may be made of Mo, Al, Cr, Au, Ti, Ni, Nd, or Cu, or a combination thereof. According to one embodiment, the scan line may have a multi-layered structure made of Mo, Al, Cr, Au, Ti, Ni, Nd, or Cu or a combination thereof. According to another embodiment, the scan line has a double-layer structure made, for example, of Mo/Al—Nd.

The scan line 120a has a predetermined width, for example, equal to or more than 3 μm and less than 5 μm and a predetermined thickness, for example, equal to or more than 300 nm and less than 450 nm. In operation, the scan line supplies a scan signal to one or more sub-pixels; that is, a scan driver positioned outside the sub-pixel area supplies scan signals to one or more sub-pixels through scan line 120a.

Because the scan line is a metal conductive line which has associated resistance characteristics, a value of a scan signal supplied to a sub-pixel near the scan driver may be different from a value of a scan signal supplied to a sub-pixel far away from the driver. More specifically, since the scan driver supplies a scan signal to sub-pixels through scan line 120a, the scan signal of each sub-pixel may have a different value due to a resistance associated with the scan line. As a result, voltage drop (IR-drop) may be caused by the resistance of the line. According to one embodiment, the thickness and/or width of the scan line is adjusted to set or control the resistance of the line, to thereby prevent or reduce the effects of a voltage drop in the values of scan signals applied to the sub-pixels connected to the line.

In one non-limiting case, scan line 120a may have a width equal to or more than 3 μm and less than 5 μm and a thickness equal to or more than 300 nm and less than 450 nm. When the width of the scan line is equal to or more than 3 μm, the resistance of the scan line is reduced or minimized and thus voltage drop in scan signal values can be prevented in spite of how far away the pixels are from the scan driver. As a result, non-uniformity in the luminance of the organic light emitting device can be reduced or prevented. When the width of the scan line is less than 5 μm, pixel shrinkage can be prevented due to an increase in the width of the scan line.

When the thickness of the scan line is equal to or more than 300 nm, the resistance of the scan line is reduced or minimized and thus voltage drop in scan signal values can be prevented. As a result, non-uniformity in luminance of the OLED can be prevented. And, when the thickness of the scan line is less than 450 nm, step coverage of layers such as an insulating layer to be formed later can be reduced. Hence, exposure of the scan line can be prevented which will prevent or reduce the chances of a short from occurring between the scan line and another conductive line.

A second insulating layer 125, which may serve as an interlayer dielectric, may be positioned on the substrate on which scan line 120a, capacitor lower electrode 120b, and gate electrode 120c are positioned. The second insulating layer may be made of silicon oxide ($SiO_2$) layer or a silicon nitride ($SiN_x$) layer, or may be a multi-layered structure that includes a combination of the aforementioned materials.

Contact holes 130b and 130c may be positioned inside second insulating layer 125 and first insulating layer 115 to expose a portion of semiconductor layer 120. A drain electrode 140c and source electrode 140d in the sub-pixel area are to be electrically connected to the semiconductor layer through the contact holes, passing through the first and second insulating layers.

The drain electrode 140c and source electrode 140d may have a single-layered or multi-layered structure. If each of the drain and source electrodes has a single-layered structure, the electrodes may be made of Mo, Al, Cr, Au, Ti, Ni, Nd, or Cu, or a combination thereof. If each of the drain and source electrodes have a multi-layered structure, the electrodes may have a double-layer structure made of Mo/Al—Nd or a triple-layer structure made of Mo/Al/Mo or Mo/Al—Nd/Mo.

The data line 140a, capacitor upper electrode 140b, and power supply line 140e may be positioned on the same formation layer as drain electrode 140c and source electrode 140d. The data line and power supply line are positioned in the non-sub-pixel area and each may have a single-layered structure or a multi-layered structure. If the data and power supply lines each have a single-layered structure, the lines may be made of Mo, Al, Cr, Au, Ti, Ni, Nd, or Cu or a combination thereof.

If the data and power supply lines each have a multi-layered structure, the lines may have a double-layer structure made of Mo/Al—Nd or a triple-layer structure made of Mo/Al/Mo or Mo/Al—Nd/Mo. If each of the data and power supply lines has a triple-layer structure, the lines may be made of Mo/Al—Nd/Mo.

The data line 140a may have a predetermined width, for example, in the range of 3 to 5 μm and a predetermined thickness, for example, in the range of 450 to 600 nm. A data driver positioned outside the sub-pixel area supplies a data signal to one or more sub-pixels through the data line.

Because data line 140a is a metal conductive line which has associated resistance characteristics, a value of a data signal supplied to a sub-pixel near the data driver may be different from a value of a data signal supplied to a sub-pixel far away from the data driver. More specifically, since the data driver supplies a data signal to one or sub-pixels through the data line, the data signal supplied the sub-pixels may have different values due to a resistance of the data line 140a. As a result, voltage drop (IR-drop) may be caused by the resistance of the data line. According to one embodiment, a thickness and/or width of the data line is adjusted to set or control the resistance of the data line, to thereby prevent or reduce the effects of a voltage drop in the values of data signals applied to the sub-pixels connected to the line.

According to one embodiment, the data line may have a width, for example, in the range of 3 to 5 μm and/or thickness, for example, in the range of 450 to 600 nm. If the width of the data line is equal to or more than 3 μm, the resistance of the data line is reduced or minimized and thus the voltage drop can be prevented. If the width of the data line is equal to or less than 5 μM, pixel shrinkage can be prevented due to an increase in the width of the data line.

Also, when the thickness of the data line is, for example, equal to or more than 450 nm, the resistance of the line is reduced or minimized and thus voltage drop can be prevented. When the thickness of the data line is, for example, equal to or less than 600 nm, step coverage of layers such as an insulating layer to be formed later can also be reduced. Hence, exposure of the data line can be prevented, thus preventing or reducing the chances of a short from forming between the data line and another conductive line.

The power supply line 140e may have a width, for example, in the range of 5 to 7 μm and/or thickness of 450 to 600 nm. The power supply line is used to supply electrical power to the sub-pixels connected to the line.

Because the power supply line 140e is a metal conductive line with associated resistance characteristics, electrical power supplied to a sub-pixel near a power supply unit (not shown) may be different from electrical power supplied to a sub-pixel far away from the power supply unit. More specifically, since the power supply unit supplies electrical power to each sub-pixel through the power supply line, the electrical power supplied to sub-pixels connected to the line may have different values due to a resistance of the line. As a result, a voltage drop (IR-drop) in electrical power values may be caused by the resistance of the power supply line. According to one embodiment, a thickness and/or width of the power supply line 140e is adjusted to set or control the resistance of the line, to thereby prevent or reduce the effects of a voltage drop in power values applied to the sub-pixels connected to the line.

According to one embodiment, the power supply line has a predetermined width, for example, in a range of 5 to 7 μm and/or a predetermined thickness, for example, in a range of 450 to 600 nm. In the foregoing example, if the width of the power supply line is equal to or more than 5 μm, the resistance of the line is reduced or minimized and thus non-uniformity in luminance caused by a voltage drop in the line can be reduced or prevented. If the width of the power supply line is equal to or less than 7 μm, sub-pixel shrinkage can also be prevented due to an increase in the width of the power supply line.

In the foregoing example, if the thickness of the power supply line is equal to or more than 450 nm, the resistance of the line is reduced or minimized and thus non-uniformity in luminance caused by the voltage drop can be reduced or prevented. If the thickness of the power supply line is equal to or less than 600 nm, step coverage of layers such as an insulating layer to be formed later can be reduced. Hence, exposure of the power supply line can be prevented, to thereby prevent or reduce the chances of a short from occurring between the power supply line and another conductive line.

According to another embodiment, data line 140a and power supply line 140e may have a triple-layer structure including Mo/Al/Mo or Mo/Al—Nd/Mo. With this structure, a thickness of a first layer may range from 40 to 60 nm, a thickness of a second layer may range from 400 to 500 nm, and a thickness of a third layer may range from 10 to 30 nm.

In a triple-layer structure, a Mo layer forming the first layer may serve as an ohmic contact to reduce resistance between the Mo layer and another layer, and a thickness of the Mo layer may range from 40 to 60 nm. An Al or Al—Nd layer forming the second layer has low resistance and may be used to reduce resistances of the line. A thickness of the Al or Al—Nd layer may range from 400 to 500 nm. A Mo layer forming the third layer may serve as a protective layer for avoiding a so-called Al or Al—Nd hillock phenomenon, in which Al or Al—Nd rises to a high temperature in a succeeding thermal process. A thickness of the Mo layer may range from 10 to 30 nm.

Figure 3:
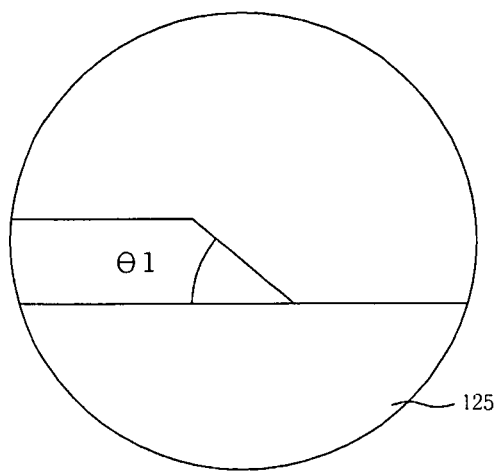
FIGS. 3 and 4 are cross-sectional views of enlarged area A in FIG. 2.
Figure 4:
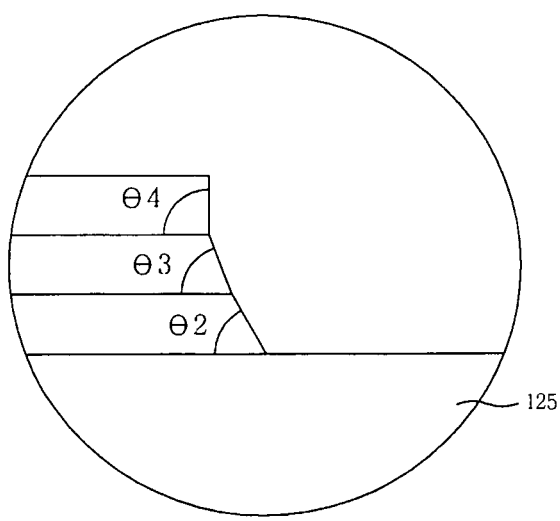

FIGS. 3 and 4 are cross-sectional views of enlarged area A in FIG. 2. As shown in these views, the data line 140a and power supply line 140e may have a single-layered structure or multi-layered structure. As illustrated in FIG. 3, when each of the data line and power supply line has a single-layered structure, a taper angle $\theta 1$ of each of the data line 140a and the power supply line 140e may lie in range substantially from 40° to 70°.

When taper angle $\theta 1$ is equal to or more than 40°, an electric field concentrates in a peaked edge portion and thus damage to an insulating layer covering the data line and power supply line can be prevented. The taper angle $\theta 1$ of each of the data line and power supply line may be equal to or more than 50° in one particular embodiment.

When the taper angle $\theta 1$ is equal to or less than 70°, step coverage of layers such as an insulating layer to be formed later can be reduced. Hence, exposure of the data line 140a and power supply line 140e can be prevented, and thus a short between the data or power supply line and another conductive line can be prevented. The taper angle $\theta 1$ of the data line and power supply line may be equal to or less than 60° in one particular embodiment.

As illustrated in FIG. 4, alternatively, data line 140a and power supply line 140e may have a multi-layered structure, for instance, a triple-layer structure including Mo/Al—Nd/Mo. When the data line and power supply line have a triple-layer structure, a taper angle $\theta 2$ of a first layer may range from 30° to 60°, a taper angle $\theta 3$ of a second layer may range from 40° to 70°, and a taper angle $\theta 4$ of a third layer may range from 70° to 90°.

Additionally, the resistances of the data and power supply lines are reduced or minimized, and voltage drop of the values applied along the length of the lines can be prevented due to a reduction in the resistances of data and power supply lines. Hence, non-uniformity in luminance can be prevented. Further, exposure of the data and power supply lines can be prevented due to a reduction in step coverage of layers such as an insulating layer to be formed later.

Thus, according to one embodiment, the width, thickness, and taper angle of each line 120a, 140a and 140e can be adjusted to set, control, or reduce resistances of the lines (including the data line 140a and the power supply line 140e) to desired values. These resistances may be set to be relative to one another.

For example, a resistance of data line 140a may be set to be lower than a resistance of scan line 120a. More specifically, the thickness of the data line may be greater than the thickness of the scan line, and the width of the data line may be greater than the width of the scan line. Hence, a cross-sectional area of data line 140a (determined by thickness and width) may be larger than a cross-sectional area of scan line 120a.

More specifically, because a supply frequency of the data signal is higher than a supply frequency of the scan signal, the data signal is sensitive to line resistance. Hence, distortion of the data signal is larger than the distortion of the scan signal. Accordingly, the resistance of the data line can be set to be lower than the resistance of the scan line, by setting the cross-sectional area of data line 140a to be larger than the cross-sectional area of scan line 120a.

In accordance with another embodiment, a resistance of power supply line 140e may be set to be lower than a resistance of data line 140a. This may be accomplished, for example, by setting the width of the power supply line may to be larger than the width of the data line. The thickness or other cross-sectional dimensions may also be set. As a result, a cross-sectional area of the power supply line (determined by the width and/or thickness) may be larger than a cross-sectional area of the data line. This may have the following effect.

While data line 140a sends data signals to sub-pixels, current does not flow into the data line in a normal state. Therefore, influence of voltage drop on the data line may be less than influence of voltage drop on the power supply line. However, since the power supply line is directly connected to the organic light emitting diode including the first electrode 155, emitting layer, and second electrode, the voltage drop of power supply line 140e directly affects non-uniformity of luminance. Accordingly, the power supply line 140e is very sensitive to the resistance.

Accordingly, the resistance of power supply line 140e may be set to be lower than the resistance of data line 140a, by setting the cross-sectional area of the power supply line to be larger than the cross-sectional area of the data line.

In accordance with some embodiments, a third insulating layer 145 may be positioned on data line 140a, capacitor upper electrode 104b, drain electrode 140c, source electrode 140d, and power supply line 140e. The third insulating layer may, for example, be a planarization layer for obviating the height difference of a lower structure. The third insulating layer may be made of an organic material such as polyimide, benzocyclobutene-based resin or acrylate or an inorganic material such as spin on glass (SOG) obtained by spin-coating silicone oxide ($SiO_2$) in the liquid form and solidifying it. Otherwise, the third insulating layer may be a passivation layer and may include a silicon oxide ($SiO_2$) layer, a silicon nitride ($SiN_X$) layer, or a multi-layered structure including a combination thereof.

A via hole 150 is positioned inside third insulating layer 145 to expose one of the source or drain electrodes 140c and 140d. The first electrode 155 is positioned on the third insulating layer to be electrically connected to one of the source and drain electrodes 140c and 140d via the via hole 150.

The first electrode 155 may be an anode electrode and may be or include a transparent electrode or a reflection electrode. When the organic light emitting device has a bottom emission or dual emission structure, the first electrode may be a transparent electrode made of indium-tin-oxide (ITO), indium-zinc-oxide (IZO), or zinc oxide (ZnO). When the organic light emitting device has a top emission structure, the first electrode may be a reflection electrode made of Al, Ag, or Ni and may be positioned under a layer formed of one of ITO, IZO, or ZnO. Also, a reflection layer made of Al, Ag, or Ni may be positioned between two layers formed of one of ITO, IZO, or ZnO.

A fourth insulating layer 160 including an opening 165 is positioned on the first electrode. The opening may serve to provide electrical insulation between neighboring first electrodes 155 and may expose a portion of the first electrode. An emitting layer 175 is positioned on the first electrode exposed by opening 165. The emitting layer may made of a material capable of emitting red, green, or blue light and, for example, may be formed using a phosphorescence material or a fluorescence material.

In a case where emitting layer 175 emits red light, the emitting layer includes a host material including carbazole biphenyl (CBP) or 1,3-bis(carbazol-9-yl (mCP), and may be formed of a phosphorescence material including a dopant material including PIQIr(acac)(bis(1-phenylisoquinoline) acetylacetonate iridium), PQIr(acac)(bis(1-phenylquinoline) acetylacetonate iridium), PQIr(tris(1-phenylquinoline)iridium), or PtOEP(octaethylporphyrin platinum) or a fluorescence material including PBD:Eu(DBM)3(Phen) or Perylene.

In the case where the emitting layer emits red light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.0 to 6.0, and a lowest unoccupied molecular orbital of the dopant material may range from 2.4 to 3.5.

In the case where the emitting layer emits green light, the emitting layer includes a host material including CBP or mCP, and may be formed of a phosphorescence material including a dopant material including Ir(ppy)3(fac tris(2-phenylpyridine)iridium) or a fluorescence material including Alq3(tris(8-hydroxyquinolino)aluminum).

In the case where the emitting layer emits green light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.5 to 6.0, and a lowest unoccupied molecular orbital of the dopant material may range from 2.0 to 3.5.

In the case where the emitting layer emits blue light, the emitting layer includes a host material including CBP or mCP, and may be formed of a phosphorescence material including a dopant material including (4,6-F2 ppy)2Irpic or a fluorescence material including spiro-DPVBi, spiro-6P, distyryl-benzene (DSB), distyryl-arylene (DSA), PFO-based polymers, PPV-based polymers, or a combination thereof.

In the case where the emitting layer emits blue light, a highest occupied molecular orbital of the host material may range from 5.0 to 6.5, and a lowest unoccupied molecular orbital of the host material may range from 2.0 to 3.5. A highest occupied molecular orbital of the dopant material may range from 4.5 to 6.0, and a lowest unoccupied molecular orbital of the dopant material may range from 2.0 to 3.5.

A second electrode 180 is positioned on or over emitting layer 175. The second electrode may be a cathode electrode and may be made of Mg, Ca, Al, or Ag having a low work function or a combination thereof. When the organic light emitting device has a top emission or dual emission structure, the second electrode may be thin to allow the second electrode to transmit a certain amount of light. When the organic light emitting device has a bottom emission structure, the second electrode may be thick to allow the second electrode to reflect light.

As described above, an organic light emitting device according to one or more embodiments can achieve uniform luminance by adjusting the taper angle and/or the resistance of the data line and/or power supply line and/or scan line relative to one another. As a result, reliability of the organic light emitting device can be improved. The taper angles may be formed using a wet (e.g., chemical etch) process or a dry (e.g., laser) etch process.

In one aspect, an organic light emitting device comprises a substrate including a sub-pixel area and a non-sub-pixel area, a scan line that is positioned in the non-sub-pixel area and supplies a scan signal to the sub-pixel area, a data line that is positioned in the non-sub-pixel area and supplies a data signal to the sub-pixel area, and a power supply line that is positioned in the non-sub-pixel area and supplies a power to the sub-pixel area, wherein a taper angle of each of the data line and the scan line substantially ranges from 40° to 70°.

In another aspect, an organic light emitting device comprises a substrate including a sub-pixel area and a non-sub-pixel area, a scan line that is positioned in the non-sub-pixel area and supplies a scan signal to the sub-pixel area, a data line that is positioned in the non-sub-pixel area and supplies a data signal to the sub-pixel area and has a triple-layer structure and a power supply line that is positioned in the non-sub-pixel area and supplies a power to the sub-pixel area and has a triple-layer structure. And in the triple-layer structure, a taper angle of a first layer substantially ranges from 30° to 60°, a taper angle of a second layer substantially ranges from 40° to 70°, and a taper angle of a third layer substantially ranges from 70° to 90° in the triple-layer structure.

In still another aspect, an organic light emitting device comprises a substrate including a non-sub-pixel area and a sub-pixel area which includes a gate electrode, a gate insulating layer positioned on the gate electrode, a semiconductor layer positioned on the gate insulating layer, a source electrode and a drain electrode electrically connected to the semiconductor layer, a first electrode electrically connected to the drain electrode, an emitting layer positioned on the first electrode, and a second electrode positioned on the emitting layer, a scan line that is positioned in the non-sub-pixel area and supplies a scan signal to the pixel area, a data line that is positioned in the non-sub-pixel area and supplies a data signal to the sub-pixel area and a power supply line that is positioned in the non-sub-pixel area and supplies a power to the sub-pixel area. A taper angle of each of the data line and the power supply line substantially ranges from 40° to 70°.

Additional embodiments relating to various color image display methods in an organic light emitting device will now be described with reference to FIGS. 5A to 5C.

Figure 5A:
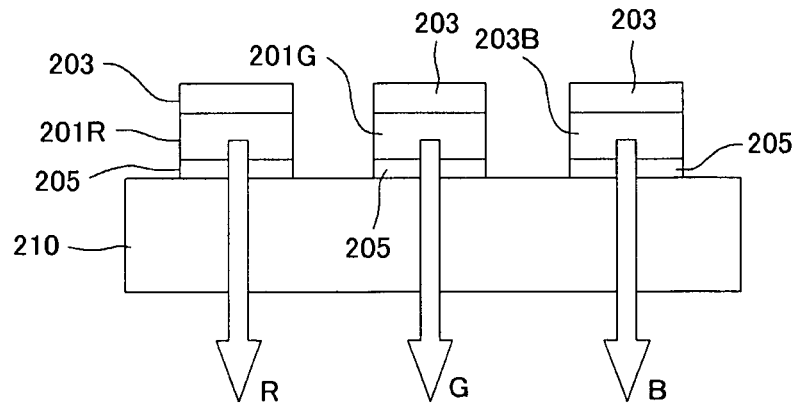
FIGS. 5A to 5C illustrate various implementations of a color image display method in an organic light emitting device according to an exemplary embodiment of the present invention.
Figure 5B:
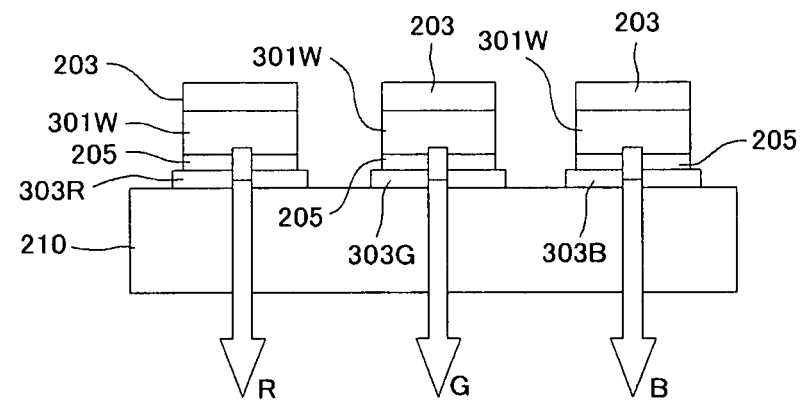
Figure 5C:
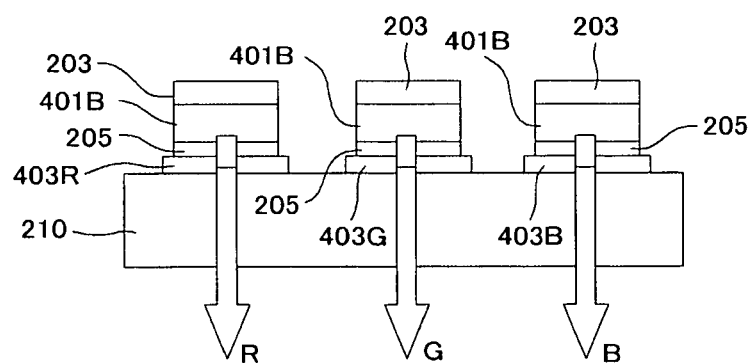

FIGS. 5A to 5C illustrate various implementations of a color image display method in an organic light emitting device according to one exemplary embodiment.

First, FIG. 5A illustrates a color image display method in an organic light emitting device separately including a red organic emitting layer 201R, a green organic emitting layer 201G and a blue organic emitting layer 201B which emit red, green and blue light, respectively.

The red, green and blue light produced by the red, green and blue organic emitting layers 201R, 201G and 201B is mixed to display a color image.

It may be understood in FIG. 5A that the red, green and blue organic emitting layers 201R, 201G and 201B each include an electron transporting layer, an emitting layer, a hole transporting layer, and the like. In FIG. 5A, a reference numeral 203 indicates a cathode electrode, 205 an anode electrode, and 210 a substrate. It is possible to variously change a disposition and a configuration of the cathode electrode, the anode electrode and the substrate.

FIG. 5B illustrates a color image display method in an organic light emitting device including a white organic emitting layer 301W, a red color filter 303R, a green color filter 303G and a blue color filter 303B. And the organic light emitting device further may include a white color filter (not shown).

As illustrated in FIG. 5B, the red color filter 303R, the green color filter 303G and the blue color filter 303B each transmit white light produced by the white organic emitting layer 301W to produce red light, green light and blue light. The red, green and blue light is mixed to display a color image.

It may be understood in FIG. 5B that the white organic emitting layer 301W includes an electron transporting layer, an emitting layer, a hole transporting layer, and the like.

FIG. 5C illustrates a color image display method in an organic light emitting device including a blue organic emitting layer 401B, a red color change medium 403R and a green color change medium 403G.

As illustrated in FIG. 5C, the red color change medium 403R and the green color change medium 403G each transmit blue light produced by the blue organic emitting layer 401B to produce red light, green light and blue light. The red, green and blue light is mixed to display a color image.

It may be understood in FIG. 5C that the blue organic emitting layer 401B includes an electron transporting layer, an emitting layer, a hole transporting layer, and the like A difference between driving voltages, e.g., the power voltages VDD and Vss of the organic light emitting device may change depending on the size of the display panel 100 and a driving manner. A magnitude of the driving voltage is shown in the following Tables 1 and 2. Table 1 indicates a driving voltage magnitude in case of a digital driving manner, and Table 2 indicates a driving voltage magnitude in case of an analog driving manner.

TABLE 1

| Size (S) of display panel | VDD-Vss (R) | VDD-Vss (G) | VDD-Vss (B) |
|---|---|---|---|
| S < 3 inches | 3.5-10 (V) | 3.5-10 (V) | 3.5-12 (V) |
| 3 inches < S < 20 inches | 5-15 (V) | 5-15 (V) | 5-20 (V) |
| 20 inches < S | 5-20 (V) | 5-20 (V) | 5-25 (V) |

TABLE 2

| Size (S) of display panel | VDD-Vss (R, G, B) |
|---|---|
| S < 3 inches | 4~20 (V) |
| 3 inches < S < 20 inches | 5~25 (V) |
| 20 inches < S | 5~30 (V) |

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An organic light emitting device comprising:
a substrate having a plurality of pixels, each pixel comprising a plurality of sub-pixels, wherein each sub-pixel includes an emission area, the emission area including a first electrode, a second electrode and an emitting layer;
a plurality of scan lines, a scan line configured to provide scan signal to a corresponding sub-pixel;
a plurality of data lines, a data line configured to supply data signal to a corresponding sub-pixel;
a plurality of power supply lines, a power supply line configured to provide power to a corresponding sub-pixel, wherein the data line and the power supply line have a triple-layer structure with different taper angles formed at respective edge portions abutting on an insulating layer, such that a first layer taper angle of the data line and the power supply line lies substantially between 30° to 60°, a second layer taper angle of the data line and the power supply line, being greater than the second layer taper angle, lies substantially between 70° to 90°.

2. The organic light emitting device of claim 1, wherein a resistance of the data line is lower than a resistance of the scan line.

3. The organic light emitting device of claim 1, wherein a thickness of the data line is larger than a thickness of the scan line.

4. The organic light emitting device of claim 1, wherein a width of the data line is larger than a width of the scan line.

5. The organic light emitting device of claim 1, wherein a resistance of the power supply line is lower than a resistance of the scan line.

6. The organic light emitting device of claim 1, wherein a resistance of the power supply line is lower than a resistance of the data line.

7. The organic light emitting device of claim 1, wherein a width of the power supply line is larger than a width of the data line.

8. The organic light emitting device of claim 1, wherein a cross-sectional area of the data line is larger than a cross-sectional area of the scan line.

9. The organic light emitting device of claim 1, wherein a cross-sectional area of the power supply line is larger than a cross-sectional area of the data line.

10. The organic light emitting device of claim 1, wherein the triple-layer structure includes Mo/Al/Mo or Mo/Al—Nd/Mo or Ti/Al/Ti.

11. An organic light emitting device comprising:
a substrate having a plurality of pixels, each pixel comprising a plurality of sub-pixels, wherein each sub-pixel includes an emission area, the emission area including a first electrode, a second electrode and an emitting layer;

a plurality of scan lines, a scan line configured to provide scan signal to a corresponding sub-pixel;

a plurality of data lines, a data line configured to supply data signal to a corresponding sub-pixel;

a plurality of power supply lines, a power supply line configured to provide power to a corresponding sub-pixel, wherein each of the data line and power supply line has a triple-layer structure with different taper angles formed at respective edge portions abutting on an insulating layer, such that a first layer taper angle of the data line and the power supply line lies substantially between 30° to 60°, a second layer taper angle of the data line and the power supply line, being greater than the first layer taper angle, lies substantially between 40° to 70°, and a third layer taper angle of the data line and the power supply line, being greater than the second layer taper angle, lies substantially between 70° to 90°, and wherein each layer of the data line or power supply line is formed from one of the group consisting of molybdenum (Mo), aluminum (Al), chromium (Cr), gold (Au), titanium (Ti), nickel (Ni), neodymium (Nd), and copper (Cu).

12. The device of claim 11, all the layers of the data line or the power supply line are made from a same material selected from the group.

13. An organic light emitting device comprising:

a substrate having a plurality of pixels, each pixel comprising a plurality of sub-pixels, wherein each sub-pixel includes an emission area, the emission area including a first electrode, a second electrode and an emitting layer;

a plurality of scan lines, a scan line configured to provide scan signal to a corresponding sub-pixel;

a plurality of data lines, a data line configured to supply data signal to a corresponding sub-pixel;

a plurality of power supply lines, a power supply line configured to provide power to a corresponding sub-pixel, wherein each of the data line and power supply line has a triple-layer structure with different taper angles formed at respective edge portions abutting on an insulating layer, such that a first layer taper angle of the data line and the power supply line lies substantially between 30° to 60°, a second layer taper angle of the data line and the power supply line, being greater than the first layer taper angle, lies substantially between 40° to 70°, and a third layer taper angle of the data line and the power supply line, being greater than the second layer taper angle, lies substantially between 70° to 90°, and wherein the emitting layer of at least one sub-pixel includes a phosphorescence material.

* * * * *